(12) United States Patent
Sanduleanu et al.

(10) Patent No.: US 7,304,518 B2
(45) Date of Patent: Dec. 4, 2007

(54) TRACK AND HOLD CIRCUIT

(75) Inventors: Mihai Adrian Tiberiu Sanduleanu, Eindhoven (NL); Eduard Ferdinand Stikvoort, Eindhoven (NL)

(73) Assignee: NXP B.V., Eindhoven (NL)

( * ) Notice: Subject to any disclaimer, the term of this patent is extended or adjusted under 35 U.S.C. 154(b) by 47 days.

(21) Appl. No.: 10/550,343

(22) PCT Filed: Mar. 22, 2004

(86) PCT No.: PCT/IB2004/050309

§ 371 (c)(1),
(2), (4) Date: Sep. 23, 2005

(87) PCT Pub. No.: WO2004/086408

PCT Pub. Date: Oct. 7, 2004

(65) Prior Publication Data
US 2006/0208782 A1    Sep. 21, 2006

(30) Foreign Application Priority Data
Mar. 28, 2003   (EP) .................................. 03100826

(51) Int. Cl.
*H03K 3/02* (2006.01)
*H03L 7/091* (2006.01)

(52) U.S. Cl. .......................... 327/185; 327/94; 327/95; 327/96; 331/1 A (58) Field of Classification Search ................ 331/1 A; 327/94, 95, 96, 185
See application file for complete search history.

(56) References Cited

U.S. PATENT DOCUMENTS

| | | | | |
|---|---|---|---|---|
| 5,081,373 A | * | 1/1992 | Suzuki | 327/94 |
| 5,625,308 A | * | 4/1997 | Matsumoto et al. | 327/203 |
| 5,757,234 A | * | 5/1998 | Lane | 330/256 |
| 6,404,285 B1 | * | 6/2002 | Shkap | 330/261 |
| 6,489,814 B2 | | 12/2002 | Hoogzaad et al. | |

* cited by examiner

Primary Examiner—Joseph Chang (57) ABSTRACT

A track and hold circuit (1) comprising:—a linear amplifier (2) receiving a differential analog signal (D+, D−) and being controlled by a first binary clock signal (H+) having a first phase,—the linear amplifier (2) providing a feed-forward input signal substantially equal with the differential analog signal (D+, D−) to a pseudo latch circuit (3) in the first phase of the first binary clock signal (H+), said pseudo latch circuit (3) being controlled by a second binary clock signal (H−) for memorizing the input signal and providing a differential output signal (LD+, LD−) substantially equal with the input signal during a second phase of the first binary clock signal (H−), the second binary clock signal being substantially in antiphase with the first binary clock signal (H+).

9 Claims, 8 Drawing Sheets

TRACK AND HOLD CIRCUIT

The invention relates to a track and hold circuit The invention further relates to a phase locked loop comprising such track and hold circuits.

Track and Hold (T/H) circuits are well known from their use in analog to digital converter circuits. During a tracking phase, an analog input amplitude is followed by the T/H circuit and in a hold phase the analog amplitude is memorized, the T/H circuit providing the memorized signal at an output. There is a trade-off between the speed of operation and precision in a T/H circuit i.e. the more precise the slower the T/H.

Data and clock recovery (DCR) circuits may be considered as Phase Locked Loops (PLL) for Non Return to Zero (NRZ) signals, which are used in modern optical communication networks at frequencies situated in GHz range. In this frequency range it is relatively hard to implement DCR circuits using the same hardware as in lower frequency ranges as e.g. flip-flops. Any flip-flop has some fundamental delays as a delay determined by a clock signal and a decision delay i.e. a time necessary for an output to become stable. These delays are technology dependent and therefore they cannot be made very small. Hence, there is a need to find devices for replacing flip-flops in relatively high frequencies devices as DCRs.

A possible solution may be a T/H circuit. U.S. Pat. No. 6,489,814 shows a T/H circuit comprising a series coupling of an input buffer, a pn-junction switch and a hold capacitor. A feedback is provided between the hold capacitor and the input buffer and a second pn-junction switch is provided to disable the feedback during the hold mode. The feedback improves linearity of the device but decreases the maximum operation frequency. Furthermore, when differential signals are considered, the circuit substantially increases in complexity, which is not advantageous for integration.

It is an object of the invention to provide a T/H circuit, which is operable at relatively high frequencies having a relatively simple structure.

This object is achieved in a T/H circuit comprising
a linear amplifier receiving a differential analog signal and being controlled by a first binary clock signal having a first phase and a second phase, the linear amplifier providing a feed-forward input signal substantially equal with the differential analog signal,
a pseudo latch circuit being controlled by a second binary clock signal for memorizing the feed forward input signal and for providing a differential output signal substantially equal with the feed-forward input signal during the second phase of the first binary clock signal, the second binary clock signal being substantially in anti-phase with the first binary clock signal. i.e. phase shifted by 90 degrees. The T/H circuit uses both phases of the T/H circuit in U.S. Pat. No. 6,489,814. Furthermore, there is no feedback and therefore the T/H circuit is not slowed down by the feedback. Instead the signal provided by the linear amplifier is directly feed-forward to the pseudo latch circuit.

In an embodiment of the invention the linear amplifier comprises a first common source pair of transistors biased in their common source terminals by a switcheable current source via a first switch controlled by the first binary clock signal and receiving at their gates the differential analog signal, the linear amplifier further comprising a common drain transistor having a gate coupled via substantially equal resistors to the respective gates of the pair of transistors for determining drain currents flowing through the pair of transistors. Let us consider that the pair of transistors comprises transistors having the same area and that the common drain transistor has a different area. Let us further note the common resistors as R and the current flowing through it as i. The following relations may be written:

$$\begin{cases} V_{iD} = 2iR \\ V_{iD} = V_T + \sqrt{\frac{2i_1}{\beta_1}} - V_T - \sqrt{\frac{2i_1}{\beta_3}} + iR \\ V_{iD} = iR + V_T + \sqrt{\frac{2i_3}{\beta_3}} - V_T - \sqrt{\frac{2i_2}{\beta_1}} \\ i_3 = I_B - (i_1 + i_2) \end{cases} \quad (1)$$

In relations (1) $\beta_1$ and $\beta_3$ are coefficients related to the dimensions of the pair of transistor and common drain transistor, respectively. $V_T$ is a threshold voltage of the transistors. $i_1$ and $i_2$ are the currents through the pair of transistors. $V_{iD}$ is the differential input signal and $I_B$ is the current provided by the switcheable current source and $i_3$ is a current through the common drain transistor. $i_3$ is quadratic with respect to the input differential voltage $V_{iD}$ as in eq. (2).

$$i_3 = \frac{I_B}{1 + 2\left(\frac{w_1}{w_3}\right)}\left(1 - \frac{\beta_1 v_{iD}^2}{4 I_B}\right) \quad (2)$$

The differential output current depends on the differential input voltage as shown in equation (3):

$$i_{OD} = i_1 - i_2 = \beta_1 \sqrt{\frac{2 I_B}{\beta_3\left(1 + 2\frac{w_1}{w_3}\right)}} \cdot v_{iD} \sqrt{1 - \frac{\beta_1 v_{iD}^2}{4 I_B}} \quad (3)$$

It is to be mentioned here that the term $\beta_1 V_{iD}^2$ has dimension of a current. It is further observed that if $I_B$ is chosen such that $\beta_1 V_{iD}^2 \ll I_B$ then relation (3) reduces to relation (4).

$$i_{OD} \approx \beta_1 \sqrt{\frac{2 I_B}{\beta_3\left(1 + 2\frac{w_1}{w_3}\right)}} \cdot v_{iD} \quad (4)$$

Hence, the current is linearly dependent on the differential input voltage.

In another embodiment of the invention the pseudo latch circuit comprises a second common source pair of transistors being biased in their common source terminals by a switcheable current source via a second switch controlled by the second binary clock signal and receiving at their gates the signal provided by the linear amplifier the pseudo latch circuit further comprising a common drain transistor having a gate coupled via substantially equal resistors to the respective gates of the second differential transistor pair for reducing bias currents through the second transistor pair, the second transistor pair being cross coupled. Cross coupling transistor pair i.e. a drain of a transistor is coupled to a gate of the other transistor and reciprocally determines a positive feedback in the pseudo latch circuit. Similarly as shown in previous relations 1-4, a current through the common drain transistor determined the currents through the second transistor pair. The current is chosen such that the overall amplification of the stage is substantially 1. Hence, the pseudo latch circuit does not commute as a standard latch circuit in which a drain of the transistor pair has a high voltage and the other drain has a low voltage and reciprocally and when the current through the transistor pair has substantially larger values. Hence, the pseudo latch circuit provides a signal substantially equal with the input signal.

In another embodiment of the invention the linear amplifier further comprises a pair of capacitors cross-coupled between a drain of a transistor of the first transistor pair and the gates of the other transistor of the first transistor pair, respectively for reducing crosstalk currents at the amplifier's output. In this case, two extra dummy transistors to generate a parasitic capacitance equal to the drain-gate capacitance of the tracking transistors, were added. The capacitance takes the injected charge at the drains of the first pair of transistors such that the netto crosstalk current flowing at the output is zero.

In an embodiment of the invention, the track and hold circuit comprises a cascaded coupling of two substantially identical linear amplifiers for better isolating the input data from the pseudo latch circuit The function of the added linear stage is to better isolate the input signal from the output signal during the hold period. The gain of the added stage is chosen substantially equal to one and therefore, in the tracking mode, the output of the combination of the two linear stages tracks the input signal. The total parasitic capacitance between input and output is reduced due to the cascade connection of the two stages and the neutrodination effect of the added capacitors. In a practical implementation an extra capacitor of 500 fF may be added at the differential output to improve the accuracy during the hold mode.

In a preferred embodiment the track and hold circuit is used in tracking data cell comprising a pair of track and hold circuits coupled to a first multiplexer. A clock signal is inputted substantially in anti-phase in the respective track and hold circuits for determining a receipt of a data signal having a rate, said track and hold circuits providing an output signal having a substantially half rate. In high-speed decision circuits, which work at full-rate of an input signal as e.g. flip-flops, latches the most difficult function is memorizing. The decision circuits have to decide at full speed and to track the input data signal sufficiently fast such that the setup and hold conditions of the decision circuits e.g. latches, flip-flops are not violated. Hence, in these conditions, a track and hold circuit helps because it comprises a pseudo latch, which holds the input data and does not to take a decision whether the input data is at a low or at a high level. The tracking data cell may be used in a Phase Locked Loop comprising a first tracking data cell and a second tracking data cell receiving an input signal and being controlled by a respective quadrature clock signals generated by a voltage controlled oscillator. The first tracking data cell is coupled to a hard limiter providing a binary data output signal. The second tracking data cell is coupled to a to delay element providing an input signal for a pair of track and hold circuits. The track and hold circuits are controlled by the binary output signal and provide a frequency correction signal for the voltage-controlled oscillator via a low-pass filter. The above-mentioned embodiment is useful in optical communication networks in said data and clock recovery circuits, which are phase locked loops for non return to zero signals. Because the frequencies involved here may be e.g. according to IEEE 802.16 as 10 to 66 GHz the half rate concept is very useful both for emitters and receivers. The phase locked loop may further comprise a frequency error detector including a first track and hold circuit and a second track and hold circuit receiving the frequency correction signal and being controlled by the binary output signal, said first and second track and hold circuits being coupled to a multiplexer means controlled by the binary output signal, the multiplexer means being coupled to a slicer providing a signal which is subtracted from the frequency correction signal in a subtractor, the subtractor providing a signal indicative for a frequency error between the frequency correction signal and the binary output signal. The phase detector output is memorized and subtracted after the first track and hold and multiplexer combination, which has the task to measure the gradient of the phase detector output and to generate a positive or a negative error when a cycle slip occurs in the phase detector output. In lock, the output of the frequency detector toggles between a negative and a positive value generating a zero average signal after a low pass filter. This is the reason to consider a possible gating mechanism to detect frequency lock condition and to cut-off the frequency loop if the frequency error is smaller than a threshold value.

Track and hold circuit according to the invention may be used in a phase detector comprising a first input circuit and second input circuit. The first and second input circuits receive respective quadrature clock signals and are controlled by input data signal. Said first and second input circuits provide respective first output signal and second output signal. The first output signal and its inverse replica are inputted to an output multiplexer controlled by the second output signal via a hard limiter. The output multiplexer provides a signal indicative for a phase error between the input data signal and clock signal.

According to the value of the second signal the phase detector output will be the first signal or the inverted replica of the first signal. When the second signal has a positive value i.e. a projection on the x-axis e.g. $+\Delta$ then the output of the phase detector is a equal to the value of the first signal. When the second signal has a negative value e.g. $-\Delta$ then it is necessary to invert the value of the first signal at the output of the phase detector. Hence, one gets an output voltage that is linearly proportional with the phase error.

The above and other features and advantages of the invention will be apparent from the following description of the exemplary embodiments of the invention with reference to the accompanying drawings, in which.

Figure 1:
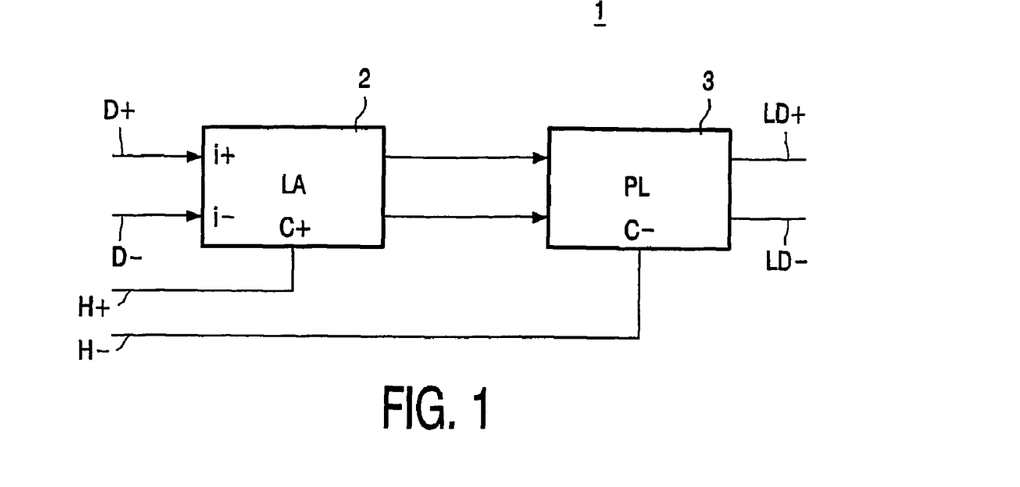
FIG. 1 depicts a block diagram of a track and hold circuit according to the invention.

FIG. 1 depicts a block diagram of a track and hold circuit 1 according to the invention. The track and hold circuit 1 comprises a linear amplifier 2, which receives a differential analog signal D+, D−. The linear amplifier 2 is controlled by a first binary clock signal H+ having a first phase. The linear amplifier 2 provides a feed-forward input signal substantially equal with the differential analog signal D+, D− to a pseudo latch circuit 3 in the first phase of the first binary clock signal H+. The pseudo latch circuit 3 is controlled by a second binary clock signal H− for memorizing the input signal. The pseudo latch circuit 3 provides a differential output signal LD+, LD− substantially equal with the input signal D+, D− during a second phase of the first binary clock signal H−. The second binary clock signal is substantially in anti-phase with the first binary clock signal H+ i.e. phase shifted with 90 degrees. The T/H circuit uses both phases of a clock signal and therefore its operating frequency substantially doubles in comparison with the T/H circuit in U.S. Pat. No. 6,489,814. Furthermore, there is no feedback and therefore the T/H circuit is not slowed down by the feedback. Instead the signal provided by the linear amplifier is directly feed-forward to the pseudo latch circuit 2.

Figure 2:
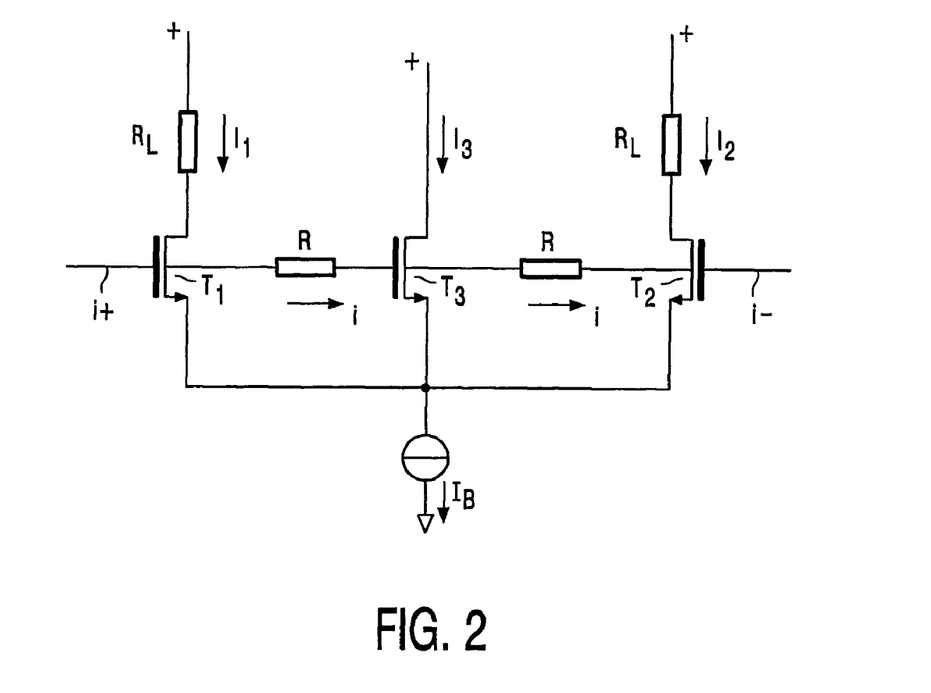
FIG. 2 depicts a transistor level of a linear amplifier, according to the invention.
Figure 3:
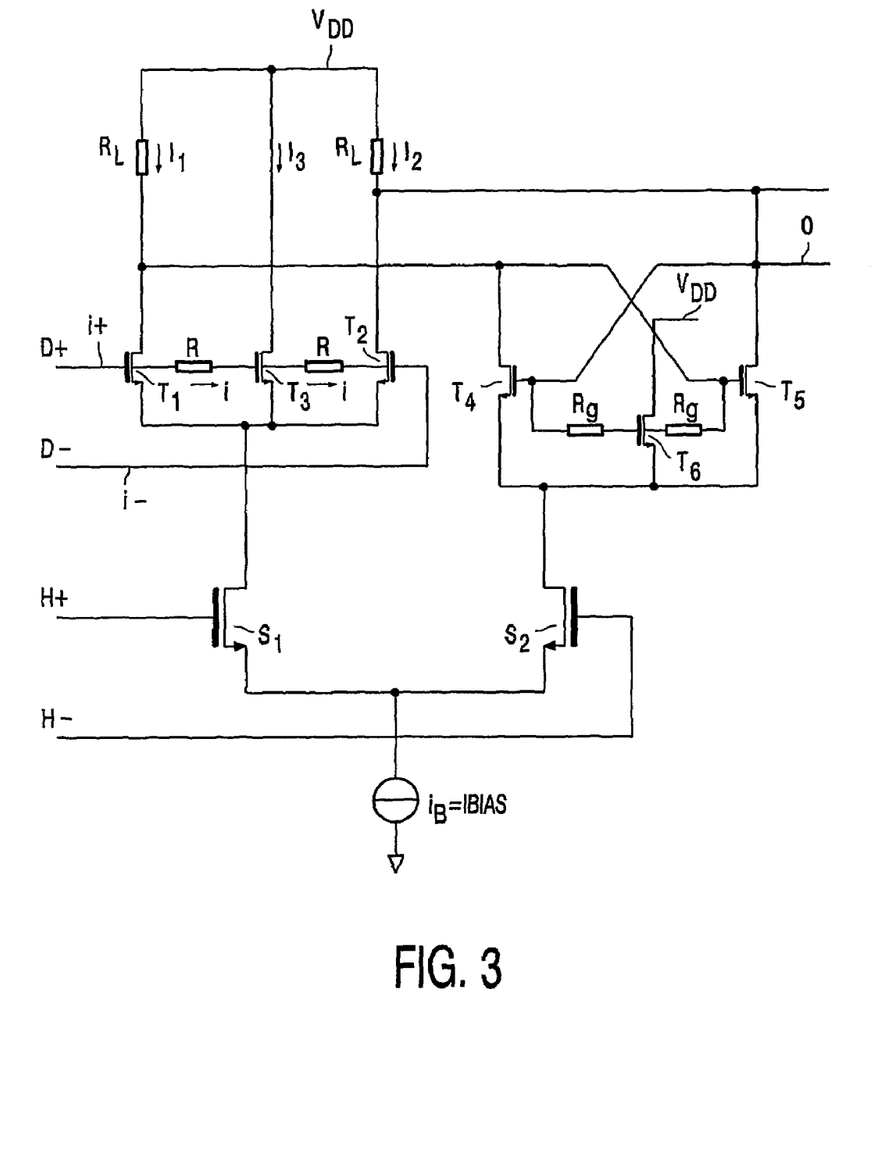
FIG. 3 depicts a transistor level of a first embodiment of a track and hold circuit, according to the invention.

FIG. 2 depicts a transistor level of a linear amplifier 2, according to the invention. The linear amplifier 2 comprises a first common source pair of transistors T1, T2 biased in their common source terminals by a switcheable current source $I_{DC}$ via a first switch controlled by the first binary clock signal H+. The first common source pair of transistors T1, T2 receives at the gates of the transistors the differential input signal D+, D−. The linear amplifier 2 further comprises a common drain transistor T3 having a gate coupled via substantially equal resistors R to the differential input signal D+, D− for determining drain currents flowing through the pair of transistors. As it was shown in relations 1 to 4, the output current is linearly dependent on the differential voltage at the input. Resistors $R_L$ converts the output current into a voltage that is further provided to the pseudo latch circuit 3. The pseudo latch circuit 3 comprises a second common source pair of transistors T4, T5 being biased in their common source terminals by a switcheable current source $I_{DC}$ via a second switch S2 controlled by the second binary clock signal H−. The second common source pair of transistors T4, T5 receives at the gates of the transistors the signal provided by the linear amplifier 2 e.g. from the drains of the first pair of common source transistors T1, T2. The pseudo latch circuit 3 further comprises a common drain transistor T6 having a gate coupled via substantially equal resistors Rg to the respective gates of the second common source pair of transistors T4, T5 for reducing bias currents through the transistors pair T4, T5. The second transistor pair T4, T5 is cross-coupled i.e. a drain of a transistors e.g. is coupled to a gate of the other transistor e.g. T5 and reciprocally. As it was shown in previous relations 1-4, a current through the common drain transistors T6 determines the currents through the second transistor pair T4, T5. The current is chosen such that the overall amplification of the stage is substantially 1. Hence, the pseudo latch circuit does not commute as a standard latch circuit in which one drain of the transistor pair has a high voltage and the other drain has a low voltage and reciprocally and when the current through the transistor pair has substantially larger values. Hence, the pseudo latch circuit 3 provides a signal OUTP, OUTN substantially equal with the input signal D+, D−. The capacitor CAP represents the input capacitance of a stage following the track and hold circuit. When relative lower frequencies are involved, an additional capacity CAP may be added for improving memorizing process in a hold state.

Figure 4:
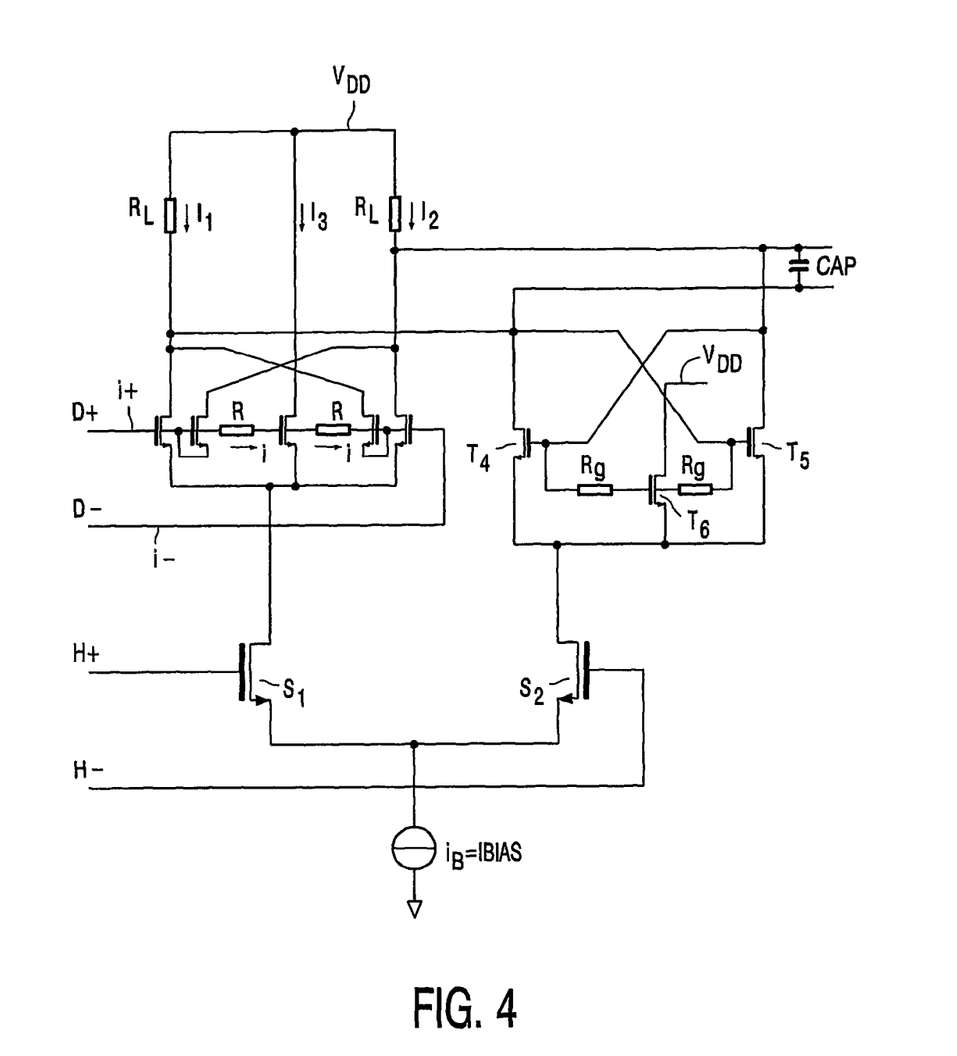
FIG. 4 depicts a second embodiment of the track and hold circuit, according to the invention.

FIG. 4 depicts a second embodiment of the track and hold circuit 1, according to the invention. The linear amplifier 2 further comprises a pair of capacitors cross-coupled between a drain of a transistor of the first transistor pair T1, T2 and the gates of the other transistor of the first transistor pair T2, T1, respectively for reducing crosstalk currents at the amplifier's output. In this case, two extra dummy transistors C to generate a parasitic capacitance equal to the drain-gate capacitance of the tracking transistors T1, T2, were added. The capacitance takes the injected charge at the drains of the first pair of transistors T1, T2 such that the netto crosstalk current flowing at the output e.g. drains of T1, T2 is substantially zero.

Figure 5:
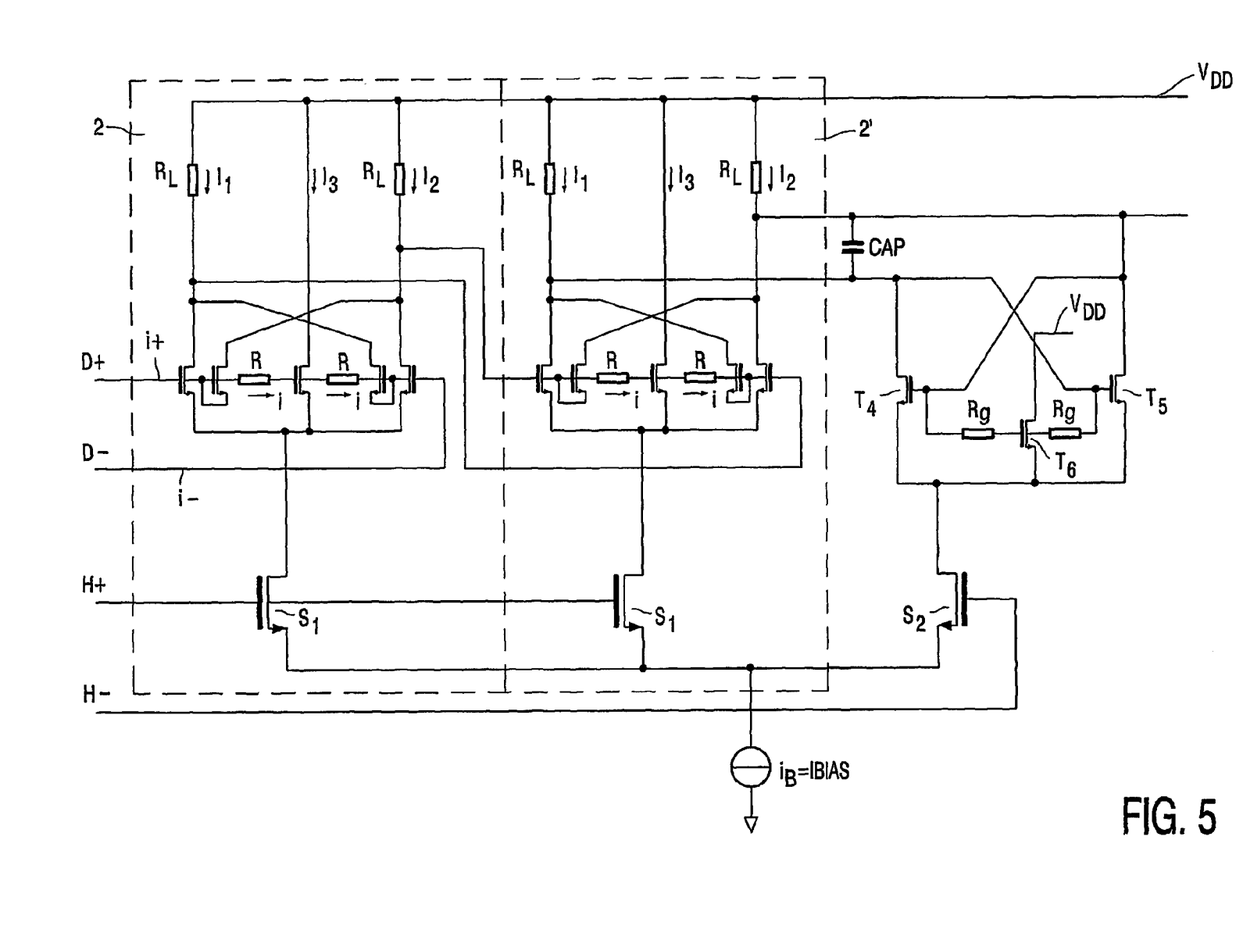
FIG. 5 depicts a third embodiment of track and hold circuit, according to the invention.

FIG. 5 depicts a third embodiment of track and hold circuit 1, according to the invention. The track and hold circuit 1 comprising a cascaded coupling of two substantially identical linear amplifiers 2, 2', for better isolating the input signal D+, D− from the pseudo latch circuit 3. The gain of the added stage is chosen equal to one and therefore, in the tracking mode, the output of the combination of the two linear stages tracks the input signal. The total parasitic capacitance between input and output is reduced due to the cascade connection of the two stages 2, 2' and the neutrodination effect of the added capacitors C. In a practical implementation an extra capacitor CAP of e.g. 500 fF may be added at the differential output to improve the accuracy during the hold mode.

Figure 6:
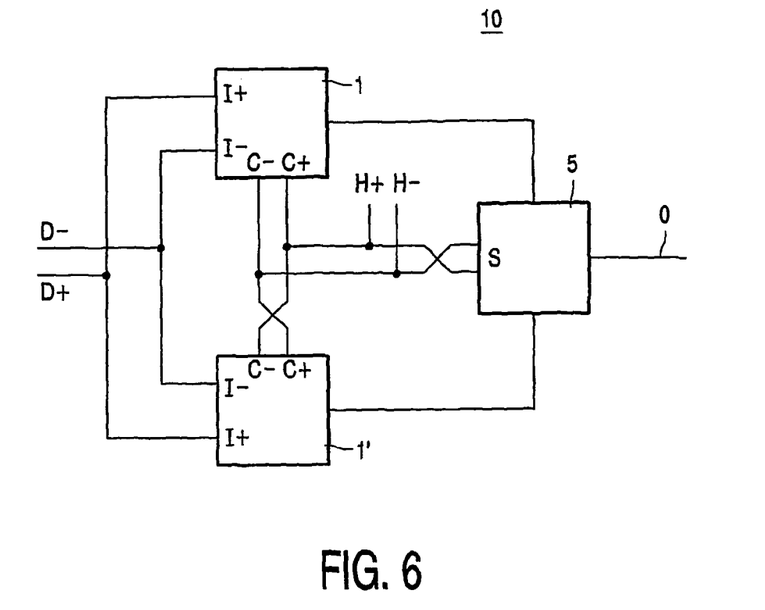
FIG. 6 depicts a tracking data cell, according to the invention.

FIG. 6 depicts a tracking data cell 10, according to the invention. The tracking data cell 10 comprises a pair of track and hold circuits 1, 1' coupled to a first multiplexer 5. A clock signal H+, H− is inputted substantially in anti-phase in the respective track and hold circuits 1, 1' for determining receipt of a data signal D+, D− having a rate. The track and hold circuits 1, 1' provide an output signal O having a substantially half rate. In high-speed decision circuits, which work at full-rate of an input signal as e.g. flip-flops, latches the most difficult function is memorizing. The decision circuits have to decide at full speed and to track the input data signal sufficiently fast such that the setup and hold conditions of the decision circuits e.g. latches, flip-flops are not violated. Hence, in these conditions, a track and hold circuit helps, because it comprises a pseudo latch as it was previously described, which holds the input data and does not to take a decision whether the input data is at a low or at a high level. Here the output signal O of the multiplexer 5 is substantially equal with the input signal D+, D−. This circuit has the advantage that the outputs of the track and hold circuits 1, 1' may be used to generate a half-rate version of the input signal by adding the two track and hold circuits 1, 1' clocked in anti-phase by the sclock signals H+, H−.

Figure 7:
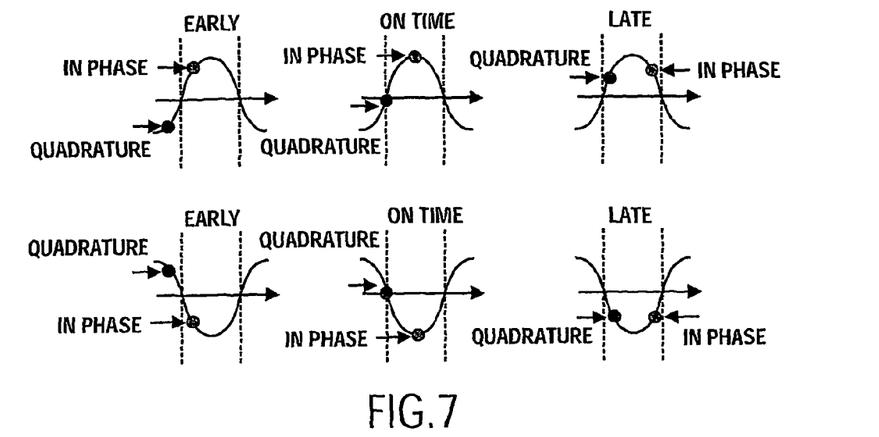
FIG. 7 depicts waveforms of a data transition tracking loop, according to the invention.
Figure 9:
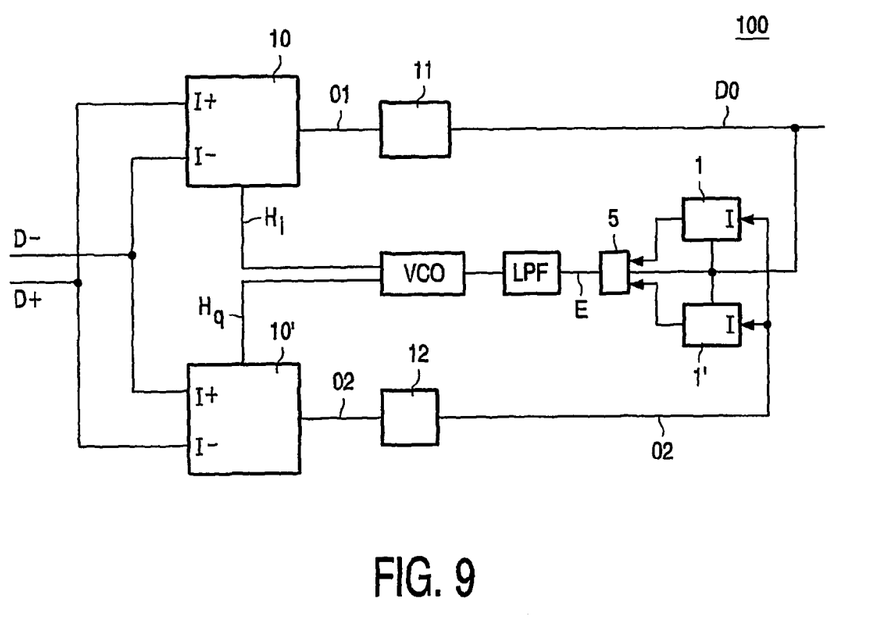
FIG. 9 depicts a phase locked loop, according to the invention.

FIG. 9 depicts a phase locked loop (PLL) 100, according to the invention. Let us suppose that there are quadrature input signals D+, D−. It was further supposed that the system is provided at its input with a limiter/buffer that are not figurated for band-limiting the input signals and as a matter of consequence, the shape of the input data is substantially sinusoidal as shown in FIG. 7. According to FIG. 7 the quadrature sample is negative if the clock is early, the quadrature sample is zero when the clock is on-time and the quadrature sample is positive when the clock is late. This situation corresponds to a positive transition of the input signal.

One can generate a phase error following the next rules:
If the input signal makes no transition then hold the previous phase-error value,
Pass the quadrature sample if the input data signal makes a low to high transition, and
If the input data makes a high to low transition pass the negative of the quadrature sample to a phase-detector output.

Figure 8:
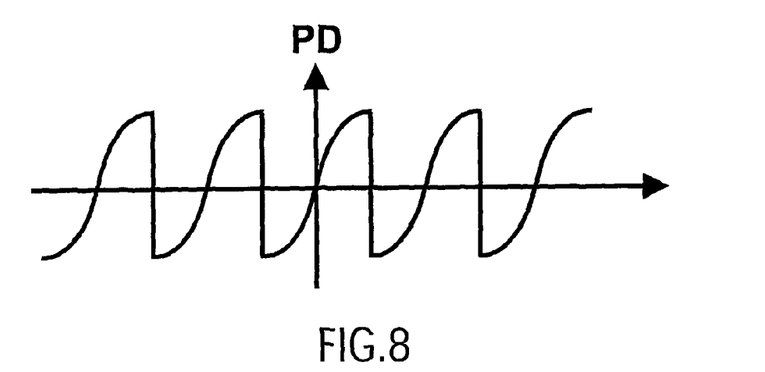
FIG. 8 depicts output waveform of a phase detector, according to the invention.
Figure 10:
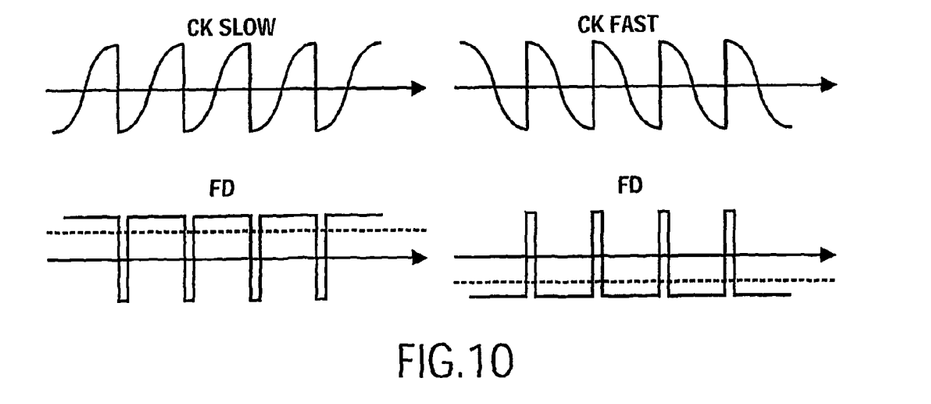
FIG. 10 depicts output signals of a phase detector used in a phase locked loop, according to the invention.

The output of the phase detector has a monotonic characteristic over a bit period as it is shown in FIG. 8. Based on the above rules for generating the phase error a PLL 100 may be derived, as shown in FIG. 9. The PLL comprises a first tracking data cell 10 and a second tracking data cell 10'. The tracking data cells 10, 10' receive an input signal D+, D− and are controlled by respective quadrature clock signals Hi, Hq generated by a voltage-controlled oscillator (VCO). The first tracking data cell 10 is coupled to a hard limiter 11 providing a binary data out signal DO. The second tracking data cell 10' is coupled to a to delay element 12 providing an input signal for a pair of track and hold circuits 1, 1'. The track and hold circuits 1, 1' are controlled by the binary output signal DO and provide a frequency correction signal E for the voltage controlled oscillator VCO via a low-pass filter LPF. The pair of track and hold circuits 1, 1' are coupled to a multiplexer 5 to implement a phase detector as was previously described. In FIG. 10 output signal E of the phase detector used in the PLL, is shown. The above-mentioned embodiment is useful in optical communication networks in said data and clock recovery circuits, which are phase locked loops for non return to zero signals. Because the frequencies involved here may be according to IEEE 802.16 as 10 to 66 GHz and the half rate concept is very useful both for emitters and receivers.

Figure 11:
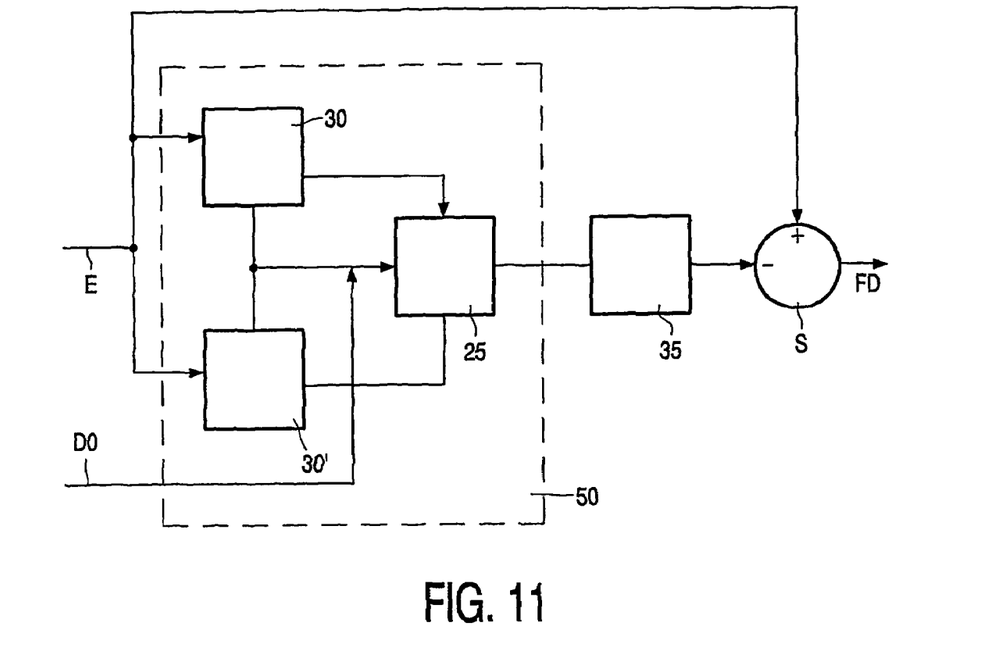
FIG. 11 depicts a frequency error detector, according to the invention.

FIG. 11 depicts a frequency error detector 50, according to the invention. The frequency error detector 50 includes a first track and hold circuit 30 and a second track and hold circuit 30' receiving the frequency correction signal E. The track and hold circuits 30, 30' are controlled by the binary output signal DO. The first and second track and hold circuits 30, 30' are coupled to a multiplexer 25 controlled by the binary output signal DO. The multiplexer 25 being coupled to a slicer 35 providing a signal which is subtracted from the frequency correction signal E in a subtractor S. The subtractor S provides a signal FD indicative for a frequency error between the frequency correction signal E and the binary output signal DO. The phase detector output E is memorized and subtracted after the first track and hold and multiplexing process, which has the task to measure the gradient of the phase detector output E and to generate a positive or a negative error when a cycle slip occurs in the phase detector output signal. In lock, the output of the frequency detector toggles between a negative and a positive value generating a zero average signal after a low pass filter LPF. This is the reason to consider a possible gating mechanism to detect frequency lock condition and to cut-off the frequency loop if the frequency error is smaller than a threshold value.

Figure 12:
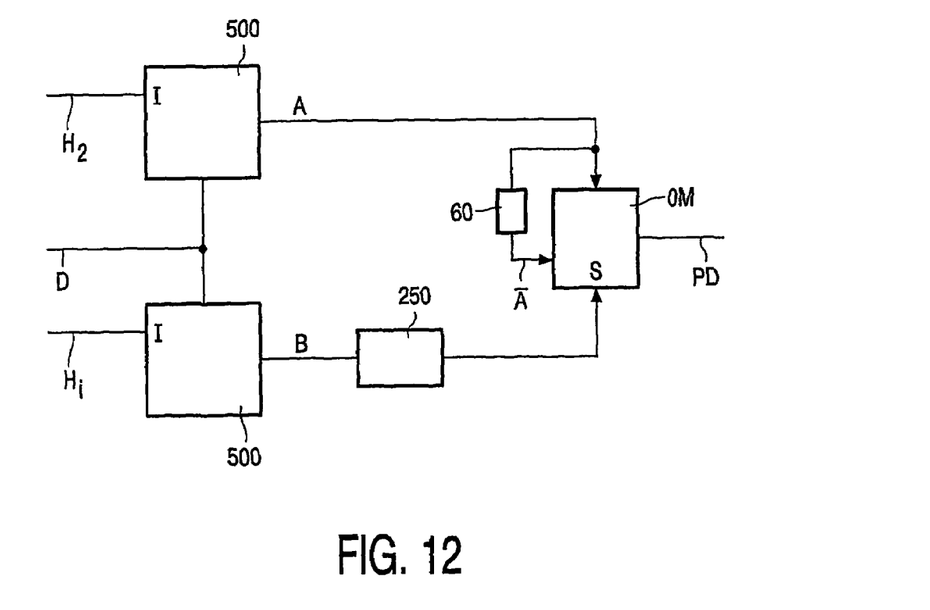
FIG. 12 depicts a phase error detector according to the invention.
Figure 13:
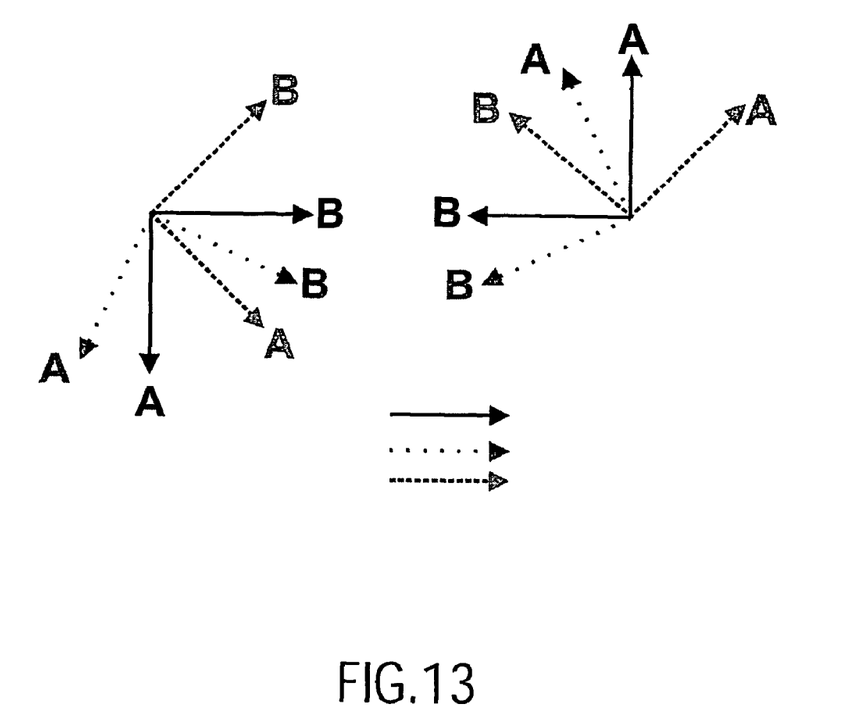
FIG. 13 depicts quadrature vectors generated by a phase detector, according to the invention.

FIG. 12 depicts a phase error detector according to the invention. The phase detector comprises a first input circuit 500 and second input circuit 500'. First and second input circuits 500, 500' receive respective quadrature clock signals Hq, Hi. The first and second circuits 500, 500' are controlled by input data signal D and provide respective first output signal A and second output signal B. The first output signal A and its inverse replica i.e. obtained via an inverter 60 is inputted to an output multiplexer OM controlled by the second output signal B via a hard limitter 250. The output multiplexer OM provide a signal PD indicative for a phase error between the input data signal Hq, Hi and clock signal D. The selection signal of the output multiplexer is a quantized version of the B signal. Therefore, we can use a limiter or a digital multiplexer to generate the signal B. FIG. 13 presents the vector diagram for three possible situations: late, in-phase and early. According to the value of second signal B the phase detector output is either A or the inverted value of A. When second signal B has a positive value i.e. the projection on the x-axis e.g. $B=\Delta$ then the output of the phase detector is a equal to the value of A. When the second signal B has a negative value e.g. $B=-\Delta$ then it is necessary that the first signal to be inverted. Hence, we get an output signal linearly proportional to the phase error. The logic behind the generation of the phase error is presented in Table 1.

TABLE 1

| | | | |
|---|---|---|---|
| $B = +\Delta$ | $A = -\Delta$ | EARLY | $PD = -\Delta$ |
| $B = +\Delta$ | $A = +\Delta$ | LATE | $PD = +\Delta$ |
| $B = -\Delta$ | $A = -\Delta$ | LATE | $PD = +\Delta$ |
| $B = -\Delta$ | $A = +\Delta$ | EARLY | $PD = -\Delta$ |

In FIG. 13 it is presented a vector diagram for $B=\Delta$ and $B=-\Delta$. It is remarked that the scope of protection of the invention is not restricted to the embodiments described herein. Neither is the scope of protection of the invention restricted by the reference numerals in the claims. The word 'comprising' does not exclude other parts than those mentioned in the claims. The word 'a(n)' preceding an element does not exclude a plurality of those elements. Means forming part of the invention may both be implemented in the form of dedicated hardware or in the form of a programmed purpose processor. The invention resides in each new feature or combination of features. Aspects shown but not claimed maybe claimed in a copending application.

The invention claimed is:

1. A track and hold circuit comprising: a linear amplifier receiving a differential analog signal and being controlled by a first binary clock signal having a first phase and a second phase, the linear amplifier providing a feed-forward input signal substantially equal with the differential analog signal a pseudo latch circuit being controlled by a second binary clock signal for memorizing the feed forward input signal and for providing a differential output signal substantially equal with the feed-forward input signal during the second phase of the first binary clock signal, the second binary clock signal being substantially in anti-phase with the first binary clock signal.

2. A track and hold circuit as claimed in claim 1, wherein the linear amplifier comprises a first common source pair of transistors biased in their common source terminals by a switchable current source via a first switch controlled by the first binary clock signal and receiving at their gates the differential analog signal the linear amplifier further comprising a common drain transistor having a gate coupled via substantially equal resistors to the gates of the first common source pair of transistors for determining drain currents flowing through the pair of transistors.

3. A track and hold circuit as claimed in claim 1, wherein the pseudo latch circuit comprises a second common source pair of transistors being biased in their common source terminals by a switchable current source via a second switch controlled by the second binary clock signal and receiving at their gates the signal provided by the linear amplifier, the pseudo latch circuit further comprising a common drain transistor having a gate coupled via substantially equal resistors to the respective gates of the second differential transistor pair for reducing bias currents through the second transistor pair, the second transistor pair being cross coupled.

4. A track and hold circuit as claimed in claim 2, wherein the linear amplifier further comprises a pair of capacitors cross-coupled between a drain of a transistor of the first transistor pair and the gates of the other transistor of the first transistor pair, respectively for reducing crosstalk currents at the amplifier's output.

5. A track and hold circuit comprising a cascaded coupling of two substantially identical linear amplifiers as claimed in claim 4, for better isolating the input data from the pseudo latch circuit.

6. A tracking data cell comprising a pair of track and hold circuits as claimed in claim 1 coupled to a first multiplexer, a clock signal being inputted substantially in anti-phase in the respective track and hold circuits for determining a receipt of a data signal having a rate, said track and hold circuits providing an output signal having a substantially half rate.

7. A Phase Locked Loop comprising a first tracking data cell and a second tracking data cell as claimed in claim 6 receiving an input signal and being controlled by a respective quadrature clock signals generated by a voltage controlled oscillator, the first tracking data cell being coupled to a hard limiter providing a binary data out signal, the second tracking data cell being coupled to a to delay element providing an input signal for a pair of track and hold circuits, the track and hold circuits being controlled by the binary output signal and providing a frequency correction signal for the voltage controlled oscillator via a low-pass filter.

8. A Phase Locked Loop comprising a first tracking data cell and a second tracking data cell as claimed in claim 6 receiving an input signal and being controlled by a respective quadrature clock signals generated by a voltage controlled oscillator, the first tracking data cell being coupled to a hard limiter providing a binary data out signal,the second tracking data cell being coupled to a to delay element providing an input signal for a pair of track and hold circuits, the track and hold circuits being controlled by the binary output signal and providing a frequency correction signal for the voltage controlled oscillator via a low-pass filter further comprising a frequency error detector comprising an input circuit including: a first track and hold circuit and a second track and hold circuit as claimed in claim 1, receiving the frequency correction signal and being controlled by the binary output signal, said first and second track and hold circuits being coupled to a multiplexer means controlled by the binary output signal the multiplexer means being coupled to a slicer providing a signal which is subtracted from the frequency correction signal in a subtractor, the subtractor providing a signal indicative for a frequency error between the frequency correction signal and the binary output signal.

9. A phase detector comprising a first input circuit and second input circuit as claimed in claim 8, first and second input circuits receiving respective quadrature clock signal, being controlled by input data signal and providing respective first output signal and second output signal, the first output signal and its inverse replica being inputted to an output multiplexer controlled by the second output signal via a hard limiter and providing a signal indicative for a phase error between the input data signal and clock signal.

* * * * *